United States Patent
Schütz

[11] Patent Number: 5,912,471
[45] Date of Patent: Jun. 15, 1999

[54] APPARATUS AND METHOD FOR MONITORING THE COATING PROCESS OF A THERMAL COATING APPARATUS

[75] Inventor: Matthias Schütz, Zurich, Switzerland

[73] Assignee: Sulzer Metco AG, Wohlen, Switzerland

[21] Appl. No.: 08/951,253

[22] Filed: Oct. 16, 1997

[30]     Foreign Application Priority Data

Oct. 21, 1996 [CH]   Switzerland ............................ 2561/96

[51] Int. Cl.$^6$ ................................................. G01N 21/86
[52] U.S. Cl. ....................................... 250/559.4; 250/574
[58] Field of Search .......................... 250/559.4, 559.41, 250/573, 574, 222.2; 219/121.47, 121.51, 121.55, 76.16; 356/441, 442

[56]             References Cited

U.S. PATENT DOCUMENTS 5,047,612  9/1991  Savkar et al. ...................... 219/121.47
5,180,921  1/1993  Moreau et al. ..................... 250/227.11

Primary Examiner—Que T. Le
Attorney, Agent, or Firm—Tarolli, Sundheim, Covell, Tummino & Szabo

[57]               ABSTRACT

In order to render it possible to give a forecast relating to the quality of a coating layer applied to a substrate by a thermal coating apparatus, an apparatus is provided, comprising a plurality of sensors and/or comprises optical means, in order to separately monitor the radiation emitted by the heated particles entrained by the coating jet in particular areas along a section of the coating jet extending crosswise to the direction of the coating jet. The apparatus further comprises electronic circuitry connected to the outputs of the sensors for further processing the measured values. By means of such an apparatus, the coating jet can be systematically and representatively scanned and monitored. On the basis of the signals supplied by the sensors, the spatial distribution of the intensity of the electromagnetic radiation emitted by the heated particles can be determined and can be used as a relevant parameter for qualitatively judging the coating layer or for regulating the coating process.

35 Claims, 2 Drawing Sheets

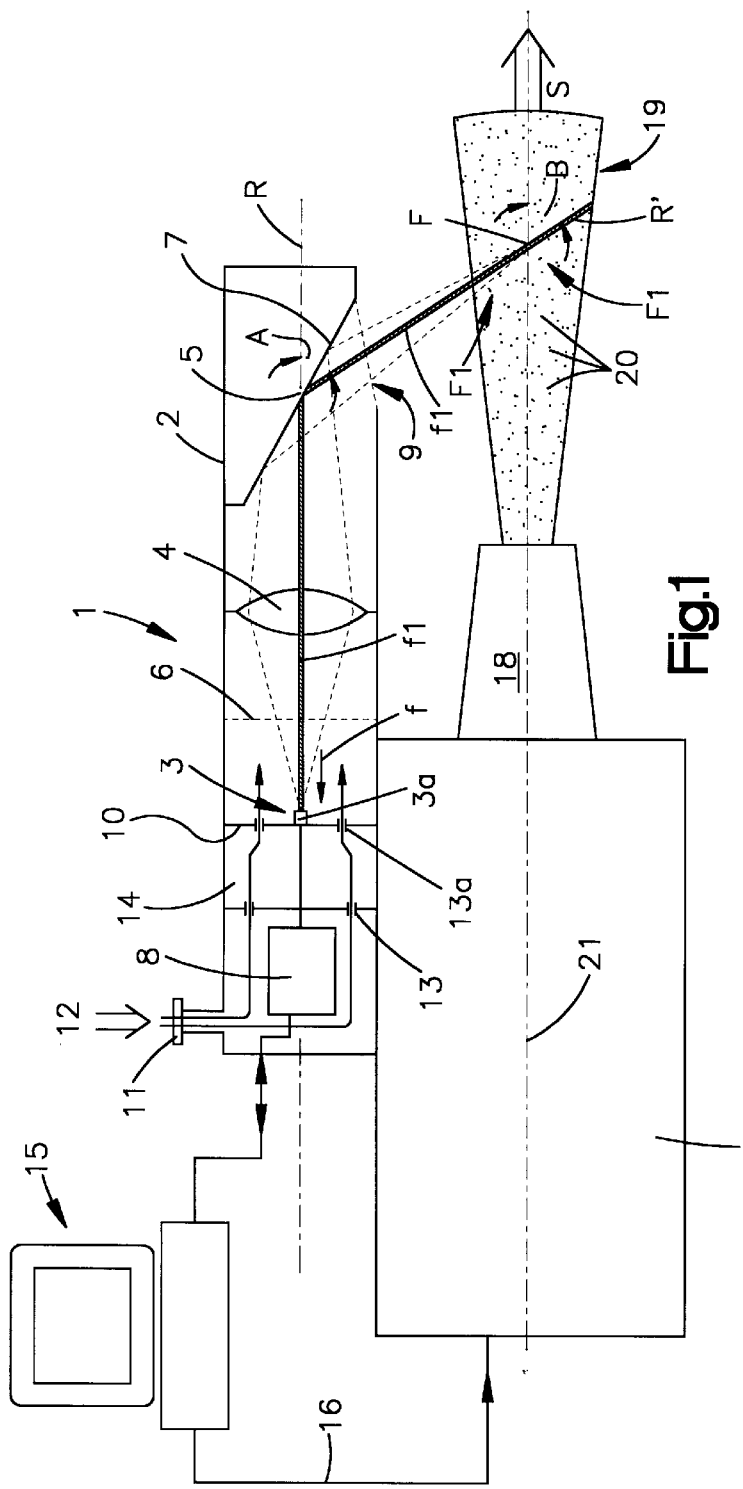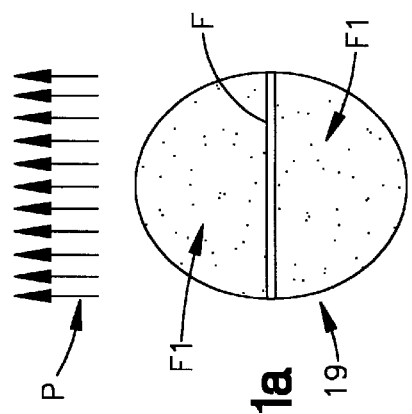

APPARATUS AND METHOD FOR MONITORING THE COATING PROCESS OF A THERMAL COATING APPARATUS

FIELD OF THE INVENTION

The present invention refers to an apparatus for monitoring the coating process of a thermal coating apparatus, comprising means for measuring the electromagnetic radiation emitted by the particles entrained by the coating jet of the thermal coating apparatus and electronic means for evaluating the results delivered by the means for measuring the electromagnetic radiation. Moreover, the invention refers to a method for monitoring the coating process of a thermal coating apparatus of the kind referred to herein above.

PRIOR ART

In order to enable one to give a forecast of the quality of a coating layer applied by a thermal coating apparatus in the course of the coating process, the method of measuring the temperature and the velocity of the heated particles entrained in the coating jet has proven to be the most reliable one known up to now.

A method and an apparatus for measuring the temperature and the velocity of the heated particles entrained in the coating jet is disclosed in U.S. Pat. No. 5,180,921. This apparatus comprises a sensor head which is connected to a detection apparatus by means of an optical fibre. In the detection apparatus, the temperature as well as the velocity of the particles can be determined, but essentially only punctually. In order to determine the velocity of the particles, the optical fibre is provided at its end with a slit mask having two slits. With the help of these two slits, located in a well known distance from each other, the time can be measured which is required by a particle to cover a path corresponding to the mutual distance of the two slits. On the basis of the measured time and the known distance, the speed can be calculated.

In contrast to other methods and apparatuses still in use nowadays, this apparatus does not need a separate light source for the illumination of the particles, because the intrinsic radiation of the particles is used for monitoring their position in each case.

For the determination of the temperature of the particles, the so-called "two-color pyrometry technique" is used. The intrinsic radiation of the particle received by the sensor is split and led to two separate photo detectors. Thereby, in front of each photo detector, an interference filter is located, the two filter having different wave length characteristics.

Even if this method and the apparatus based thereon yields, strictly speaking, quite informative measuring results, which can be used to qualitatively judge the coating process, such a method is complicated and the related apparatus expensive. Moreover, an essentially punctual measurement includes the danger that the measurement is taken at a location within the coating jet which is not informative enough or not representative for the entire coating jet.

Particularly, an essentially punctual measurement cannot yield an information with respect to the dispersion of the particles entrained by the coating jet; in other words, it cannot be recognized and checked, respectively, whether or not the particles are evenly distributed over the cross section of the coating jet.

Another problem, particularly serious in the case of plasma spraying, results from the fact that the electrode or electrodes required for creating the plasma torch melt down whereby the molten material, usually tungsten, is unwantedly applied to the substrate by means of the coating jet. If such tungsten particles are unwontedly applied to the substrate, the coating layer usually has to be removed and the substrate has to be coated again. Particularly costly are such tungsten nests if they are detected only during or after the subsequent finishing of the work piece.

In some cases, such tungsten particles can be recognized by an experienced operator as flying sparks. However, prerequisite therefor is that the operator follows the entire coating process with very high attention. Particularly in the case of mass production, e.g. in the automotive industry, and/or in the case of adverse environmental conditions, a continuous and highly attentive visual observation is nearly impossible. An aggravating fact is added insofar as the particles entrained by the plasma jet often move at a speed of more than 50 m/s; in such a case, a visual observation is to be excluded. Finally, it must be pointed out that it is not at all possible to detect the presence of such unwanted tungsten particles in the coating jet by performing only punctual measurements.

OBJECTS OF THE INVENTION

Thus, it is an object of the invention to provide a method and an apparatus for monitoring the coating process of a thermal coating apparatus by means of which the coating jet and the electromagnetic radiation emitted by the particles entrained thereby, respectively, can be systematically monitored, whereby the apparatus should be simple in design to be manufactured at low costs, whereby the method and the apparatus should have a high sensitivity as far as the parameters to be monitored are concerned, and whereby the apparatus and the method should enable one to give a reliable forecast with respect of the quality of the coating to be expected.

SUMMARY OF THE INVENTION

In order to meet these and other objects, the invention provides, according to a first aspect, an apparatus for monitoring the coating process of a thermal coating apparatus, comprising means for measuring the electromagnetic radiation emitted by the particles entrained by the coating jet of the thermal coating apparatus and electronic means for evaluating the results delivered by the means for measuring the electromagnetic radiation. The means for measuring the electromagnetic radiation include means for separately monitoring the radiation emitted by the particles in particular areas along a section of the coating jet extending crosswise to the direction of the coating jet.

Such an apparatus which includes means for separately monitoring the radiation emitted by the particles in particular areas along a section of the coating jet extending crosswise to the direction of the coating jet renders possible to systematically scan the plasma jet in a representative manner insofar as its composition, i.e. the particles entrained thereby, can be quantitatively and qualitatively monitored over its entire cross section. Moreover, it is possible to increase the sensitivity in certain sections of the plasma jet by a suitable design of the electronic means for evaluating the results delivered by the measuring means. Similarly, by a suitable design of the electronic means for evaluating the results delivered by the measuring means, any desired further processing of these signals is possible to give a reliable forecast of the quality of the coating even during the coating process.

According to a preferred embodiment, the afore mentioned means for separately monitoring the electromagnetic radiation comprises a sensor assembly incorporating a plurality of sensors, for example a number of between eight and sixty-four sensors. By the provision of such a high number of sensors, the sensitivity with respect to the measured radiation is increased. Additionally, cross checks of the signals delivered by the particular sensors are thereby made possible; a measuring technique which opens completely new prospects as far as the processing of the measurement signals is concerned.

For example, as will be further described with reference to a preferred embodiment, the spatial distribution of the intensity of the electromagnetic radiation emitted by the heated particles can be monitored.

In this connection, it was surprising to learn that it is not required in most cases to measure the temperature and the velocity of the particles heated in and entrained by the plasma jet, but that it is sufficient in the vast majority of cases to bring in the spatial distribution of the intensity of the electromagnetic radiation emitted by the heated particles as relevant parameter for judging the quality of the coating layer to be expected. By measuring the spatial distribution of the intensity of the electromagnetic radiation emitted by the heated particles, a statement can be given concerning the energy distribution in the plasma jet which is essential for the quality of the coating. In the present case, the energy stored in a single particle essentially depends on its temperature and its velocity. The kinetic energy induced into the single particle is consciously not taken into consideration in this connection.

According to a further preferred embodiment, the above mentioned means for separately monitoring the radiation comprises a comparator means for detecting signal values exceeding a predetermined threshold value, whereby the comparator means includes a peak value memory. By the provision of such a peak value circuitry, it is possible to detect and recognize particles entrained in the plasma jet which substantially exceed the size of an average particle. With such a peak value circuitry, particularly metallic particles, e.g. tungsten particles, shall be recognized which melt down from the electrode during the operation of the coating apparatus and which impair the quality of the coating layer applied onto a substrate.

The same is correspondingly true as far as the provision of a differentiating circuitry is concerned, which can be provided as an alternative to a peak value circuitry in another preferred embodiment.

According to a second aspect, the invention provides a method for monitoring the coating process of a thermal coating apparatus, whereby the apparatus similarly comprises means for measuring the electromagnetic radiation emitted by the particles entrained by the coating jet of the thermal coating apparatus and electronic means for evaluating the results delivered by the means for measuring the electromagnetic radiation. Again similarly, the means for measuring the electromagnetic radiation include means for separately monitoring the radiation emitted by the particles in particular areas along a section of the coating jet extending crosswise to the direction of the coating jet.

According to that second aspect of the invention, the method comprises the step of performing a qualitative evaluation of the coating process on the basis of the signals supplied by the means for separately monitoring the radiation emitted by the particles in particular areas along a section of the coating jet extending crosswise to the direction of the coating jet, or the step of regulating the coating process on the basis of the signals supplied by the means for separately monitoring the radiation emitted by said particles in particular areas along a section of the coating jet extending crosswise to the direction of the coating jet; or both of the above explained steps.

Preferred further method steps or variations of method steps will be further explained herein after and are defined in the appended claims.

BRIEF DESCRIPTION OF THE DRAWINGS

In the following, an embodiment of the invention will be further described, with reference to the accompanying drawings, in which:

FIG. 1 shows a schematic view of the general layout of a coating apparatus together with an embodiment of the monitoring apparatus of the invention;

FIG. 1a shows a schematic view of a portion of a plasma torch monitored by the sensors of the monitoring apparatus of the invention;

DETAILED DESCRIPTION OF A PREFERRED EMBODIMENT

Figure 3:
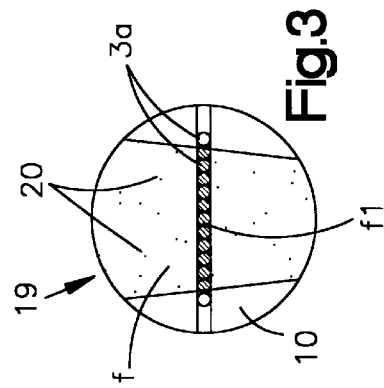
FIG. 3 shows a principle view of the sensors and of the projected picture of the plasma torch.

FIG. 1 shows a schematic view of the general layout of a thermal coating apparatus 17 together with an embodiment of the apparatus 1 for monitoring the coating process. In order to facilitate the description of the embodiment, in the following, reference will be made to a plasma coating apparatus, even if any thermally operating coating apparatus can be used in conjunction with the present invention. Since the general layout of a plasma coating apparatus and the mode of operation thereof is well known to every person skilled in the art, no detailed description thereof is required here.

In the present example, the plasma coating apparatus 17 comprises a spray gun head member 18 producing a plasma jet 19 escaping therefrom. The particles entrained in the plasma jet 19 and heated up therein are designated by reference numeral 20.

The apparatus 1 for monitoring the coating operation, shown in a schematic longitudinal view in FIG. 1, essentially comprises a housing 2 in which is provided a sensor assembly 3, an optical member in the form of a lens 4, a filter member 6 as well as a mirror 7. The further processing of the data delivered by the sensor assembly 3 is accomplished by means of an electronic processor which is shown in FIG. 1 in the form of a simple block 8. The data processed by the electronic circuitry 8 is evaluated by a computer 15. The bottom side of the housing 2 is provided with an aperture 9, and the mirror 7 is located behind that aperture 9. Preferably, and as shown in the present embodiment, the housing 2 is connected directly to the plasma spraying apparatus 17.

The mirror 7 serves for deflecting that radiation in a well defined manner in the direction of the arrows P in FIG. 1a, i.e. in the direction of the mirror 7, which is emitted by the heated particles 17 within a section F, F1 extending transversely to the plasma jet 19. The portion of the radiation of the projected section F1 hitting the mirror 7 is deflected towards the lens 4. Therefrom, a picture f of the projected section F1, called projection area, is projected via the filter 6 to a disc member 10. In the center of that projection area f, i.e. in the center of the disc member 10, a sensor assembly 3 is provided which comprises a plurality of light sensitive sensors 3a, for example twenty, which are arranged, as seen in the drawing of the present embodiment, in a horizontally extending row. By means of this assembly, each sensor receives the radiation of a crosswise extending portion F (FIG. 1a) of the plasma jet 19; thus, the plasma jet 19 is subdivided, as far as its crosswise extension is concerned, in a plurality of particular portions as far as the measurement values are concerned.

The optical monitoring elements, comprising sensor assembly mirror 7, lens 4, filter member 6 and sensor assembly 3, are related to each other such that the radiation of a portion F, F1 of the plasma jet emitted by the heated particles 17 in the direction of the crosswise running axis 5 of the mirror is directed towards the sensors 3a. The portion F, F1 projected onto the sensors 3a extends under an angle B with reference to the direction S of the flow of the coating jet 17. Usually, the angle B would amount to 20° to 90°. It should be noted that the radiation projected onto the sensors 3a corresponds to the sum of that radiation which is emitted by the particles 20 present in the section F, F1 in the direction of the crosswise running axis 5 of the mirror.

The area designated by f1 is to illustrate the optical way of the radiation projected onto the sensors, whereby it has to be considered that the area f1, in reality, has a three dimensional extension, i.e. a further extension running in a direction perpendicular to the plane of the drawing. On the basis of the signals present at the particular sensors 3a, a spatial distribution of the intensity of the radiation emitted by the heated particles 20 in the jet section F, F1 can be determined. The intensity of the radiation emitted by a single particle depends essentially on the size and the temperature of that particle.

As far as the radiation monitored by the sensors 3a is concerned, in the present connection, only the intensity is interesting, whereby the expression "intensity" shall describe the illuminance in Lux (1 m/m²).

In order to monitor a section of the plasma jet which is remote from the spray gun head member 18 and the monitoring apparatus 1, respectively, the mirror 7 is located such that its axis runs under an angle A with reference to a first optical axis R of the apparatus 1 and the housing 2, respectively. That angle A can be chosen according to the requirements and normally amounts to between 10° and 45°. Thus, a second optical axis R' of the apparatus 1 is created.

Instead of an angled mirror 7, the monitoring apparatus 1, of course, can be designed such that the first optical axis R encloses an angle of between 10° and 90° with the longitudinal axis 21 of the coating jet. For example, this can be realized such that the housing 2 would be arranged, with reference to the longitudinal axis 21 of the coating jet 19, in an oblique or crosswise manner.

The filter 6 is provided for reducing the intensity and/or for selecting the bandwidth of the spectrum of the radiation projected onto the sensors 3i. Thereby, it is possible to use a filter which is variable as far as its attenuation of the radiation and/or its spectral characteristics are concerned; preferably, such a filter could be controllable by means of the computer 15. Particularly, a filter could be used whose characteristics can be controlled and changed, respectively, by applying an electric voltage. Moreover, it is possible to provide a plurality of filters arranged one behind the other one. The sense of such a filter can also be seen in that stray radiation, produced for example by the sun or an other external illumination, can be filtered out, or that an overmodulation of the sensors 3a is avoided. The sensors 3a used in this connection preferably respond to radiation in the infrared and/or visible region.

In order to provide for a cooling of the housing 2, together with the components 3, 4, 6, 7 and 8 located therein, the housing 2 is provided with an inlet manifold 11 by means of which cooling air 12 is directed into the housing 2. Such cooling air 12 is conducted through the housing 2 by means of passages 13, 13a and finally escapes from the housing 2 through an aperture 9. The cooling air has the effect, besides a cooling of the components 3, 4, 6, 7 and 8, that the housing 2 is under a certain overpressure such that no contamination can enter the housing 2 through the aperture 9. That effects is important insofar as the coating apparatus is subjected to strong emissions, particularly if walls of hollow chambers are to be coated.

Figure 2:
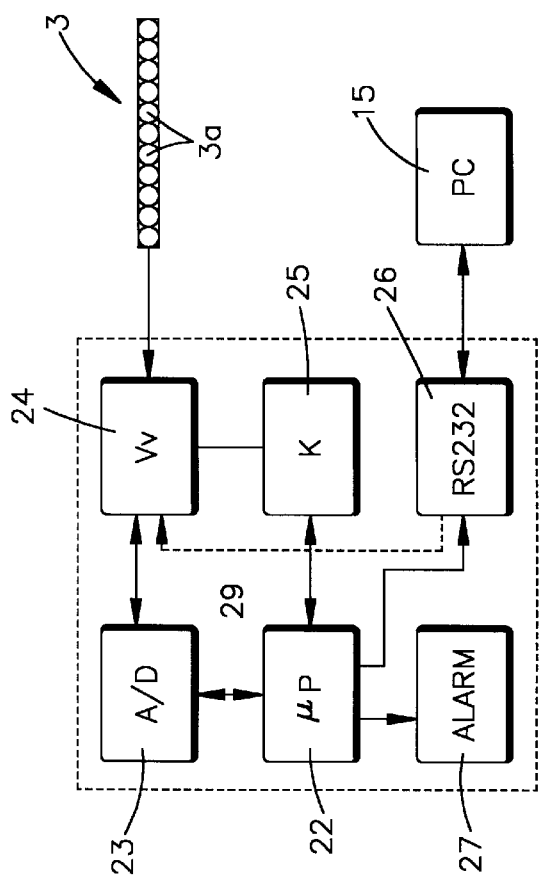
FIG. 2 shows a block diagram of the apparatus of the invention.

FIG. 2 shows by means of a strictly simplified block diagram 8 the electronic components connected to the sensor assembly 3 as well as their interaction. The apparatus, in fact, essentially comprises, besides the sensor assembly 3 and the computer 15 which may be a simple PC, a micro processor 22, an A/D-converter 23 each incorporating a multiplexer, several preamplifiers 24, several comparators 15 each incorporating a peak value memory means, a serial interface 26 as well as an alarm output 27. It is understood that for each particular sensor 3a a preamplifier 24 as well as a comparator 25 with peak value memory is provided. Preferably, the preamplifiers 24 are designed such that not only their offset voltage, but also their amplification factor is adjustable by means of the computer 15; such a design is illustrated by means of the broken line 29.

In order to monitor the spatial distribution of the intensity of the coating, the signal present at a particular sensor 3a is amplified in the preamplifier 24, fed to the A/D-converter 23 via the multiplexer and, thereafter, processed by the micro processor 22. From the micro processor 22, the data are transferred via the serial interface 26 to the computer 15, where a qualitative evaluation of parameters is performed which are relevant for the quality of the coating. For example, the spatial distribution of the intensity of the electromagnetic radiation emitted by the heated particles is monitored.

For the detection of particles entrained in the coating jet which considerably surpass the average size of a coating particle, the output of the particular preamplifier 24 is additionally connected to a comparator 25 incorporating a peak value memory. As a comparison value, the input of the particular comparator 25 is provided with a signal which is computed by the micro processor 22 and corresponds to a mean value of the intensity of the radiation measured at the particular sensor 3a during a certain time span. For providing such a comparison signal voltage, a D/A-converter is provided between the micro processor 22 and the comparator 25, which, however, is not shown in the drawings. As soon as the measured value has exceeded the reference value by a certain amount, the micro processor 22 sends a signal to the alarm output 27. The objective to be attained by such a threshold value circuit may be seen in the fact that particles which eventually can be entrained in the coating jet are recognized, particularly such particles which do not origin from the coating powder itself. As an example, tungsten particles can be named which are emitted by the electrode essential for the creation of the plasma torch. Usually, such tungsten particles substantially impair the quality of the coating layer and, thus, are to be avoided.

For the detection of such tungsten particles, instead of using a peak value circuit, also a differentiating circuitry can be used. The advantage of a differentiating circuitry may be seen in the fact that such a circuitry responds only to quick, relative changes of the signal, but not to slow, absolute changes of the signal. Thus, a differentiating circuitry is relatively insensitive to operationally caused fluctuations and external influences. On the other hand, for the purpose of differentiating the signal, the latter one has to be recorded with a high scanning or sweep rate, and within the short available time, a difference has to be calculated. The consequence is that as such a differentiating circuitry, as compared to a peak value circuit, an electronic circuitry must be provided which is substantially lavish and costly. However, since such differentiating circuitry is well known in the art, it is not necessary to further explain this alternative.

Instead of providing a plurality of sensors, it is also possible to provide optical means to capture or monitor the radiation in a section of the coating jet, namely subdivided into particular areas in the cross sectional direction which can be individually measured. For example, such means can be constituted by a movable mirror member which allows by a pivoting movement to monitor the characteristics of the coating jet in its entire width. A further possibility could consist in providing a step lens whose particular step regions project a particular image of the coating jet onto the sensor assembly. Finally, a combination of such means would also be possible.

FIG. 3 shows a view, enlarged as compared to the view according to FIG. 1, of the sensors 3a together with the projection area f falling onto the disc member 10 of the projected section F, F1 of the coating jet 19. Thereby, the area captured by the sensors 3a is shown in a hatched illustration. As can be seen from that figure, the sensors 3a preferably overlap the plasma jet on both sides, with the result that the plasma jet 19 is captured by the sensors 3a in its whole width even if it performs a relative movement. Moreover, it can be seen in this figure that the density of the particles is highest in the region of the center of the plasma jet 19 and is lowest in the region of its border. Thus, this means that in the case of a desired even distribution of the particles 20 in the plasma jet 19, the radiation is highest in the center, while it is lowest in the border regions.

Figure 4:
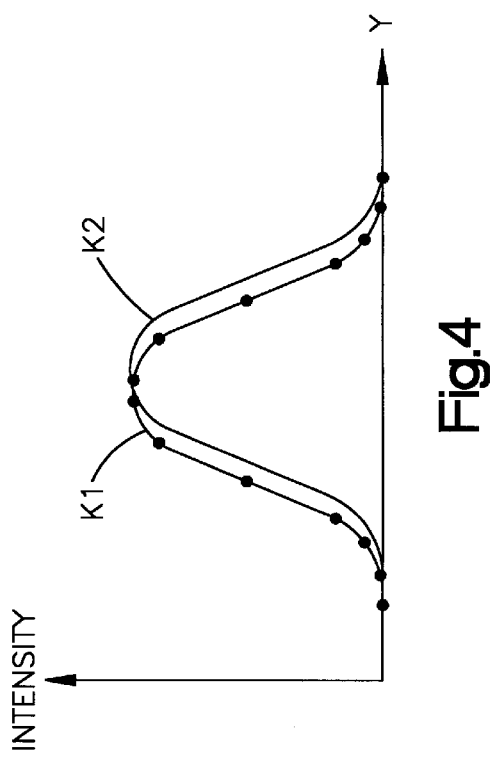
FIG. 4 shows a diagram in which the measurement values present at the particular sensors are illustrated.

FIG. 4 shows a diagram illustrating the measurement values present at the particular sensors in a certain moment, interconnected by a line. Thereby, the instantaneous value curve is designated by K1 and the desired value curve is designated by K2. From the curve K1 shown in the diagram, the following information can be extracted and determined:

the spatial distribution of the radiation emitted by the heated particles;

the intensity of the captured radiation;

the crosswise extension of the coating particles entrained in the coating jet;

the position of the coating jet.

On the basis of these data, a qualitative assessment of the coating to be expected can be made. The recording of such a curve can be done fully automatically by means of the computer 15.

It is under stood that the apparatus of the present invention is arranged with reference to an annular surface coaxial to the plasma jet such that the changes of the plasma jet to be expected and the heated particles entrained therewith, respectively, takes place, if possible, crosswise to the monitoring area of the apparatus; in this way, any changes with respect to the distribution of the particles are recognizable for the monitoring apparatus. Because the particles usually are fed to the plasma jet in radial direction, this means that the apparatus should be located in a plane running perpendicularly to a plane disposed through the longitudinal axis of the plasma jet and feed nozzle for the coating powder.

Instead of a visual judgement and evaluation of the resulting curve, the measured result can be arithmetically evaluated. For example, the resulting instantaneous value curve K1 can be compared to a desired value curve K2. Thereby, parameters can be set for the recorded parameters; if those parameters are exceeded, a warning can be made visible or an alarm can be initiated.

Moreover, absolutely possible is that the recorded values are inputted as real time values into a control circuitry by means of which the plasma coating apparatus is fully automatically controlled. In other words, thereby, the operating parameters of the apparatus, namely for example the magnitude of the current, the amount of the particles, the velocity of the carrier gas, the velocity of the plasma gas and the amount of the gas can be varied. That possibility of providing such a control circuit is illustrated in FIG. 1 by a connection 16 between the computer 15 and the plasma spraying apparatus 17.

What is claimed is:

1. An apparatus for monitoring the coating process of a thermal coating apparatus, comprising:

means for measuring the electromagnetic radiation emitted by the particles entrained by the coating jet of the thermal coating apparatus; and electronic means for evaluating the results delivered by said means for measuring said electromagnetic radiation;

said means for measuring the electromagnetic radiation including means for separately monitoring the radiation emitted by said particles in particular areas along a section of the coating jet extending crosswise to the direction of the coating jet.

2. An apparatus according to claim 1 in which said means for separately monitoring the electromagnetic radiation comprises a sensor assembly means incorporating a plurality of sensors.

3. An apparatus according to claim 2 in which said sensor assembly means comprises a number of between eight and sixtyfour sensors.

4. An apparatus according to claim 2 in which said sensors of said plurality of sensors are arranged along a straight line one besides another one.

5. An apparatus according to claim 1 in which said means for measuring the electromagnetic radiation comprises a sensor assembly means incorporating optical means for separately monitoring the radiation emitted by said particles in particular areas along a section of the coating jet extending crosswise to the direction of the coating jet.

6. An apparatus according to claim 5 in which said optical means comprises means for changing the spatial region of the section of the coating jet which is measured by said means for measuring the electromagnetic radiation.

7. An apparatus according to claim 1 in which said electronic means comprises a computing means for evaluating the spatial distribution of the intensity of the electromagnetic radiation emitted by the heated particles on the basis of the signals supplied by said means for separately monitoring the radiation.

8. An apparatus according to claim 1 in which said means for separately monitoring the radiation comprises a comparator means for detecting signal values exceeding a predetermined threshold value.

9. An apparatus according to claim 1 in which said comparator means includes a peak value memory means.

10. An apparatus according to claim 1 in which said means for separately monitoring the radiation comprises a plurality of comparator means for detecting signal values exceeding a predetermined threshold value, each comparator means of said plurality of comparator means being assigned to one of said sensors of said plurality of sensors, and each comparator means of said plurality of comparator means including a peak value memory means.

11. An apparatus according to claim 1 in which said electronic means comprises a differentiating circuitry means for detecting an increase of the value of the signal supplied by said means for separately monitoring the radiation exceeding a predetermined value within a defined time period.

12. An apparatus according to claim 2 in which each sensor of said sensor assembly means is provided with a preamplifier means.

13. An apparatus according to claim 5 in which said optical means comprises auxiliary means for monitoring the electromagnetic radiation emitted by the heated particles in a section extending substantially along a diameter line of the coating jet and for projecting the monitored radiation of said section onto the sensor assembly means.

14. An apparatus according to claim 13 in which said auxiliary means comprises a mirror means for deflecting the monitored radiation of said section towards the sensor assembly.

15. An apparatus according to claim 14 in which the surface of said mirror means include an angle of between 10° and 45° with a first optical axis of the apparatus for monitoring the coating process and the central longitudinal axis of the coating jet, respectively, thereby creating a second optical axis.

16. An apparatus according to claim 13 in which said auxiliary means are arranged such that a second optical axis of the apparatus for monitoring the radiation encloses an angle of between 10° and 90° with the central longitudinal axis of the coating jet.

17. An apparatus according to claim 2 in which said sensor assembly means comprises a filter means for adjusting and changing, respectively, the intensity and/or the spectrum of the electromagnetic radiation received by said sensor assembly means.

18. An apparatus according to claim 1 in which said sensor assembly means, said optical means and at least a part of said electronic means are enclosed by a housing, said apparatus further comprising means for creating a permanent excess pneumatic pressure in the interior of said housing, whereby said housing is provided with an aperture for allowing the pressurized gas to escape from the interior of said housing.

19. A method for monitoring the coating process of a thermal coating apparatus, said apparatus comprising:
means for measuring the electromagnetic radiation emitted by the particles entrained by the coating jet of the thermal coating apparatus; and
electronic means for evaluating the results delivered by said means for measuring said electromagnetic radiation;
said means for measuring the electromagnetic radiation including means for separately monitoring the radiation emitted by said particles in particular areas along a section of the coating jet extending crosswise to the direction of the coating jet;
said method comprising either one or both of the following two steps:

(i) performing a qualitative evaluation of the coating process on the basis of the signals supplied by said means for separately monitoring the radiation emitted by said particles in particular areas along a section of the coating jet extending crosswise to the direction of the coating jet;

(ii) regulating the coating process on the basis of the signals supplied by said means for separately monitoring the radiation emitted by said particles in particular areas along a section of the coating jet extending crosswise to the direction of the coating jet.

20. A method according to claim 19, further comprising the step of computing the spatial distribution of the intensity of the electromagnetic radiation emitted by the heated particles on the basis of the signals supplied by said means for separately monitoring the radiation and taking the results of said computing as the relevant basis for performing said steps (i) and/or (ii).

21. A method according to claim 19, in which said means for separately monitoring the electromagnetic radiation comprises a sensor assembly means incorporating a plurality of sensors, said method step (i) comprising the steps of:
(i1) comparing the value of the output signal of each sensor of said plurality of sensors with an index value; and
(i2) issuing a warning or triggering an alarm in the case if a predetermined difference between one of said output signals of said sensors and said index value is exceeded.

22. A method according to claim 21 in which said index value corresponds to the mean value of the output signal of the related sensor supplied during a predetermined time period.

23. A method according to claim 19, in which said means for separately monitoring the electromagnetic radiation comprises a sensor assembly means incorporating a plurality of sensors, said method step (ii) comprising the steps of:
(ii1) comparing the value of the output signal of each sensor of said plurality of sensors with an index value; and
(ii2) directly adjusting one or more of the operational parameters of the coating process in the case if a predetermined difference between one of said output signals of said sensors and said index value is exceeded.

24. A method according to claim 23 in which said values of said output signals of said sensors are used as true values for a control circuitry for the regulation of the coating process.

25. A method according to claim 21 further comprising the steps of:
obtaining a test signal by differentiating said values of said output signals of said sensors, such differentiating being performed by determining the alteration of the value of the output signal and signals, respectively, of one or more of said sensors within a defined period of time; and
performing either one or both of said steps (i2) and (ii2), respectively, in the case if said test signal exceeds a predetermined value.

26. A method according to claim 25 in which said test signal is used to monitor the presence of metallic particles molten down from the electrode and electrodes, respectively, used for creating the coating jet and entrained by said coating jet.

27. A method according to claim 25 in which said values of said output signals of said sensors are measured with a scanning rate which is, expressed in kHz, higher than the velocity of the coating jet, measured in m/s.

28. A method according to claim 27 in which said scanning rate is higher than 50 kHz.

29. A method according to claim 19 in which the electromagnetic radiation emitted by the heated particles is measured within the infrared and/or the visible spectrum.

30. A method according to claim 19 in which the electromagnetic radiation emitted by the heated particles is optically processed and projected onto said means for separately monitoring the radiation.

31. A method according to claim 30 in which the electromagnetic radiation emitted by the heated particles is projected onto said means for separately monitoring the radiation by means of at least one mirror means and/or a lens means.

32. A method according to claim 30 in which the electromagnetic radiation emitted by the heated particles is filtered before it is projected onto said means for separately monitoring the radiation.

33. A method according to claim 32 in which a filter is used which is variable with respect to the intensity and/or the spectrum of the radiation received by said means for separately monitoring the radiation.

34. A method according to claim 19 in which at least said means for separately monitoring the radiation are cooled by means of air.

35. A method according to claim 19 in which the signal(s) supplied by said means for separately monitoring the radiation are digitized and further processed in digital form.

* * * * *